(12) United States Patent
Chiu et al.

(10) Patent No.: US 7,269,391 B2
(45) Date of Patent: Sep. 11, 2007

(54) TUNABLE TRANSCEIVER FRONT END

(75) Inventors: Janice Chiu, Tustin, CA (US); Shahla Khorram, Irvine, CA (US); Qiang (Tom) Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 538 days.

(21) Appl. No.: 10/852,470

(22) Filed: May 24, 2004

(65) Prior Publication Data

US 2005/0208901 A1   Sep. 22, 2005

(51) Int. Cl.
*H04B 1/44* (2006.01)
(52) U.S. Cl. ............... 455/83; 455/78; 455/80; 455/281; 455/284; 455/326; 333/25; 330/116; 330/117
(58) Field of Classification Search ............... 343/850, 343/795, 700 MS, 749, 822, 750, 852, 860–861; 455/280–284, 289–293, 78–83, 318–328, 455/330–333, 118–126; 330/116–117; 333/15–16, 333/32–33, 25; 336/200, 223, 232; 327/355–357, 327/113, 359, 361, 119–120, 563–564
See application file for complete search history.

(56) References Cited

U.S. PATENT DOCUMENTS

| | | | | |
|---|---|---|---|---|
| 5,644,272 A | * | 7/1997 | Dabrowski | 333/26 |
| 6,009,314 A | * | 12/1999 | Bjork et al. | 455/83 |
| 6,009,318 A | * | 12/1999 | Freed | 455/326 |
| 6,315,502 B1 | * | 11/2001 | Maurer | 407/119 |
| 6,351,502 B1 | * | 2/2002 | Zargari | 375/324 |
| 6,654,595 B1 | * | 11/2003 | Dexter | 455/323 |
| 6,735,418 B1 | * | 5/2004 | MacNally et al. | 455/78 |
| 6,809,581 B2 | * | 10/2004 | Rofougaran et al. | 327/563 |
| 6,919,858 B2 | * | 7/2005 | Rofougaran | 343/850 |
| 6,982,609 B1 | * | 1/2006 | McKay et al. | 333/25 |
| 7,020,452 B1 | * | 3/2006 | Kobayashi | 455/326 |
| 7,129,803 B2 | * | 10/2006 | Khorram et al. | 333/25 |
| 2004/0253939 A1 | * | 12/2004 | Castaneda et al. | 455/341 |
| 2005/0135026 A1 | * | 6/2005 | Khorram | 361/56 |
| 2005/0215205 A1 | * | 9/2005 | Rofougaran | 455/78 |

* cited by examiner

*Primary Examiner*—Matthew D. Anderson
*Assistant Examiner*—Tuan Tran
(74) *Attorney, Agent, or Firm*—Garlick Harrison & Markison; Timothy W. Markison (57) ABSTRACT

A transceiver front end includes a transmit/receive (T/R) switch, a first balun, a second balun, a low noise amplifier, a power amplifier, and compensation circuitry. The T/R switch is operably coupled to an antenna for receiving inbound radio frequency (RF) signals and for transmitting outbound RF signals. The first balun includes a single ended winding and a differential winding, where the single ended winding is operably coupled to the T/R switch. The second balun includes a single ended winding and a differential winding, where the single ended winding is operably coupled to the T/R switch. The low noise amplifier is operably coupled the differential winding of the first balun. The power amplifier is operably coupled to the differential winding of the second balun. The compensation circuitry is operably coupled to the first balun to compensate for at least one of phase imbalance, amplitude imbalance, and impedance imbalance of the first balun.

11 Claims, 5 Drawing Sheets ground compensation circuitry 100

FIG. 3
balun circuit 87

TUNABLE TRANSCEIVER FRONT END

CROSS REFERENCE TO RELATED PATENTS

This patent application is claiming priority to patent application entitled TUNED TRANSFORMER BALUN CIRCUIT AND APPLICATIONS THEREOF, having a Ser. No. 10/802,015, and a filing date of Mar. 16, 2004.

BACKGROUND OF THE INVENTION

1. Technical Field of the Invention

This invention relates generally to wireless communication devices and more particularly to radio interfaces of such wireless communication devices.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

In many wireless applications, a radio transceiver includes one antenna that is shared by the receiver section and the transmitter section. The sharing of the antenna may be achieved by a transmit/receive switch and one or more transformer baluns. In recent advances in the wireless communication art, a transformer balun has been implemented on-chip with the receiver section and the transmitter section. In such an implementation, a single-ended winding of the transformer balun is operably coupled to the antenna and the differential winding of the transformer balun is operably coupled to the receiver section or to the transmitter section.

While the benefits of using an on-chip balun are many, there are some issues of concern, which include impedance matching of the loads on the single-ended side and on the differential side, phase imbalances, and amplitude imbalances.

Therefore, a need exists for a transceiver front end that provides for enhanced impedance matching and reduces phase and/or amplitude imbalances.

BRIEF SUMMARY OF THE INVENTION

The tunable transceiver front end of the present invention substantially meets these needs and others. In one embodiment, a transceiver front end includes a transmit/receive (T/R) switch, a first balun, a second balun, a low noise amplifier, a power amplifier, and compensation circuitry. The T/R switch is operably coupled to an antenna for receiving inbound radio frequency (RF) signals and for transmitting outbound RF signals. The first balun includes a single ended winding and a differential winding, where the single ended winding is operably coupled to the T/R switch. The second balun includes a single ended winding and a differential winding, where the single ended winding is operably coupled to the T/R switch. The low noise amplifier is operably coupled the differential winding of the first balun. The power amplifier is operably coupled to the differential winding of the second balun. The compensation circuitry is operably coupled to the first balun to compensate for at least one of phase imbalance, amplitude imbalance, and impedance imbalance of the first balun.

In another embodiment, a balanced low noise amplifier (LNA) circuit includes a balun, a low noise amplifier, and compensation circuitry. The balun includes a single ended winding and a differential winding, where the single ended winding is operably coupled to receive inbound radio frequency (RF) signals. The low noise amplifier is operably coupled the differential winding of the balun. The compensation circuitry is operably coupled to the balun to compensate for at least one of phase imbalance, amplitude imbalance, and impedance imbalance of the balun.

DETAILED DESCRIPTION OF THE INVENTION

Figure 1:
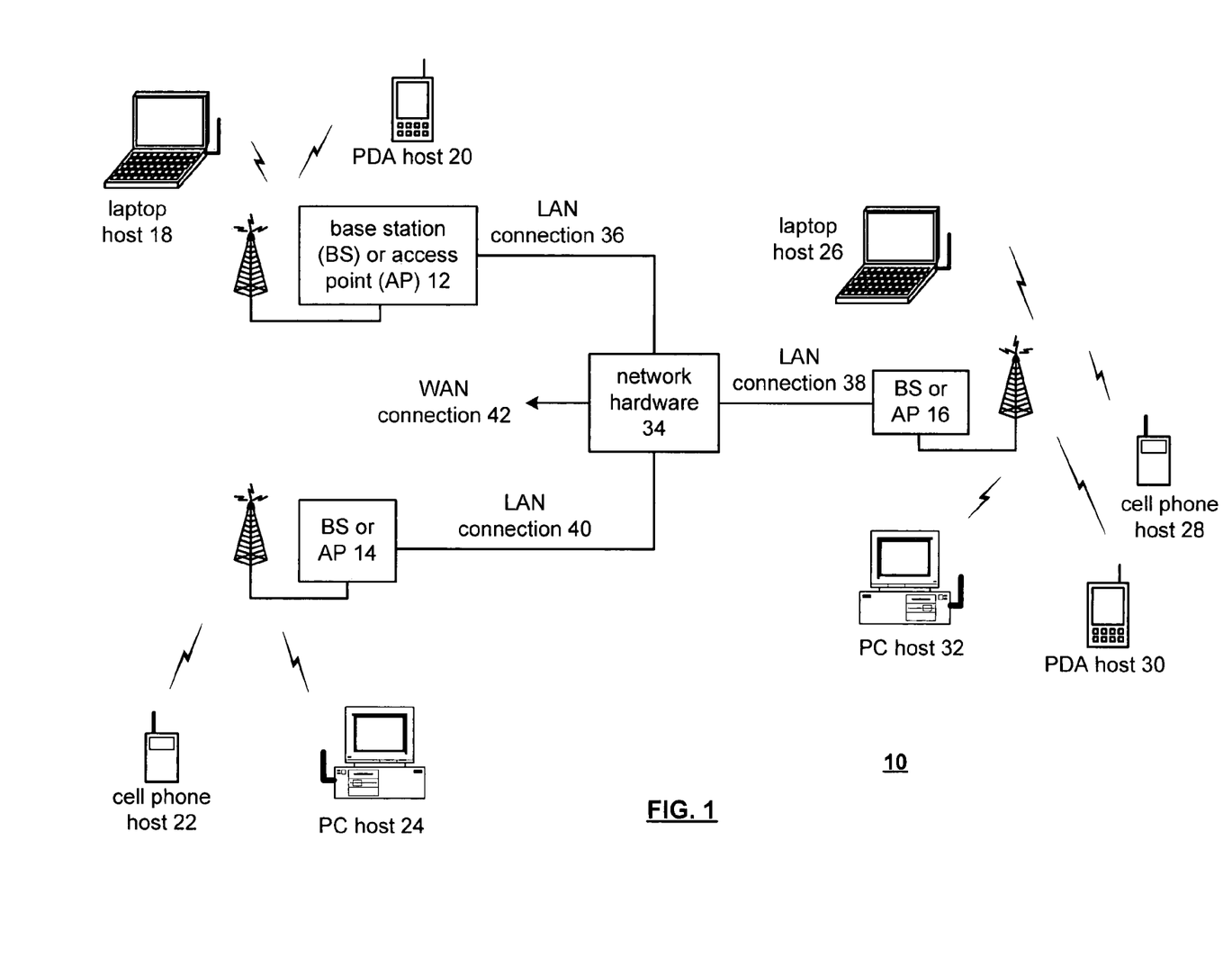
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
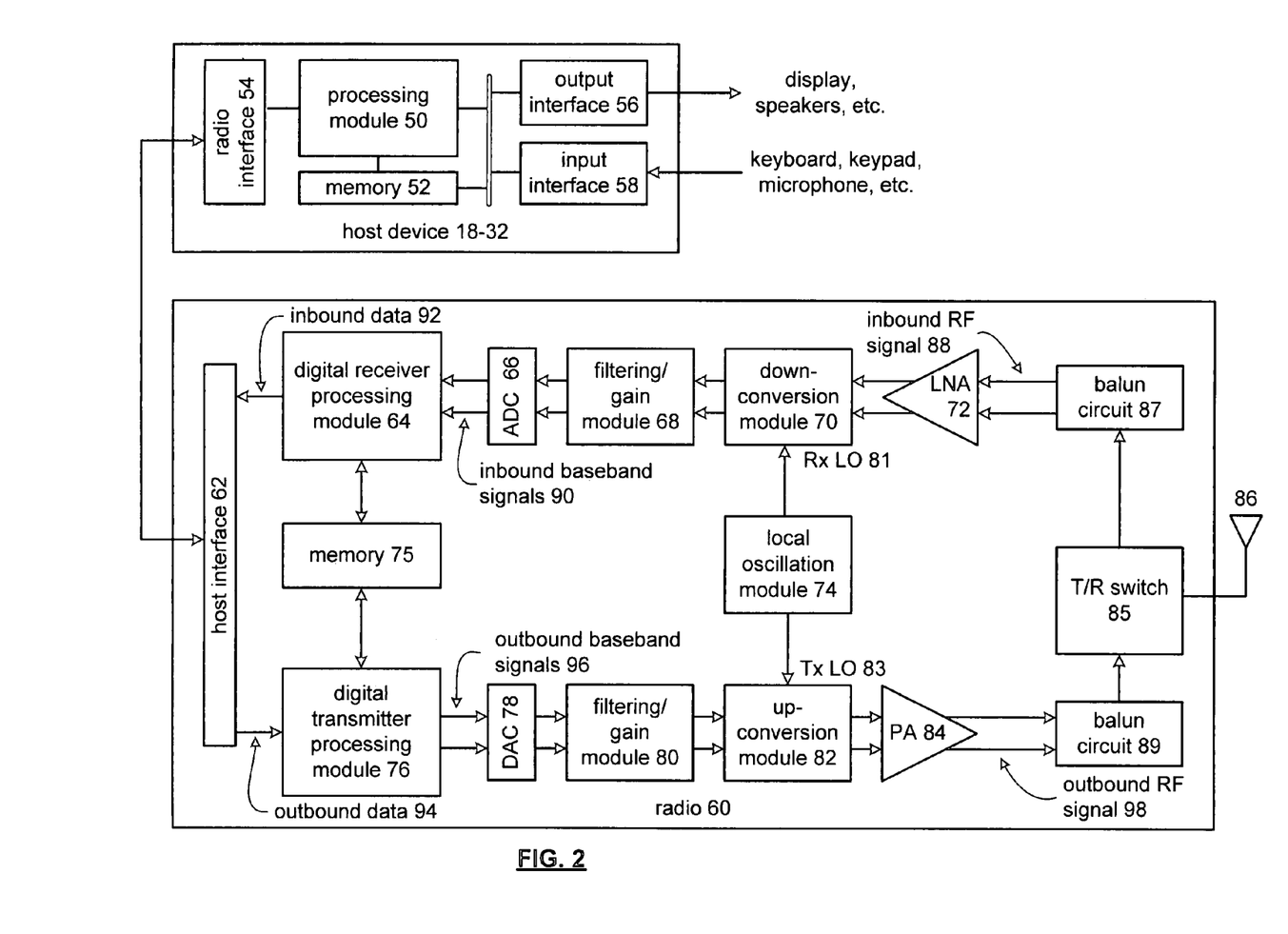
FIG. 2 is a schematic block diagram of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/gain module 68, an IF mixing down conversion stage 70, a low noise amplifier 72, a tuned transformer balun circuit 87, a local oscillation module 74, memory 75, a digital transmitter processing module 76, a digital-to-analog converter 78, a filtering/gain module 80, an IF mixing up conversion stage 82, a power amplifier 84, a second tuned transformer balun circuit 89, and an antenna 86. The antenna 86 is shared by the transmit and receive paths via the T/R switch 85. Note that the LNA 72, balun circuit 87, T/R switch 85, balun circuit 89, and PA 84 comprise a front-end of the radio transceiver.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11 Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 converts the analog baseband or low IF signal into an RF signal based on a transmitter local oscillation 83 provided by local oscillation module 74. The power amplifier 84 amplifies the RF signal to produce outbound RF signal 98, which is provide to the antenna 86 via the tuned transformer balun circuit 89, where the antenna 86 transmits the outbound RF signal 98 to a targeted device such as a base station, an access point and/or another wireless communication device. Note that the tuned transformer balun circuit 89 will be described in greater detail with reference to FIG. 6.

The radio 60 also receives an inbound RF signal 88 via the antenna 86, which was transmitted by a base station, an access point, or another wireless communication device. The antenna 86 provides the inbound RF signal 88 to the low noise amplifier 72 via the tuned transformer balun circuit 87, which will be described in greater detail with reference to FIGS. 3-5. The low noise amplifier 72 amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
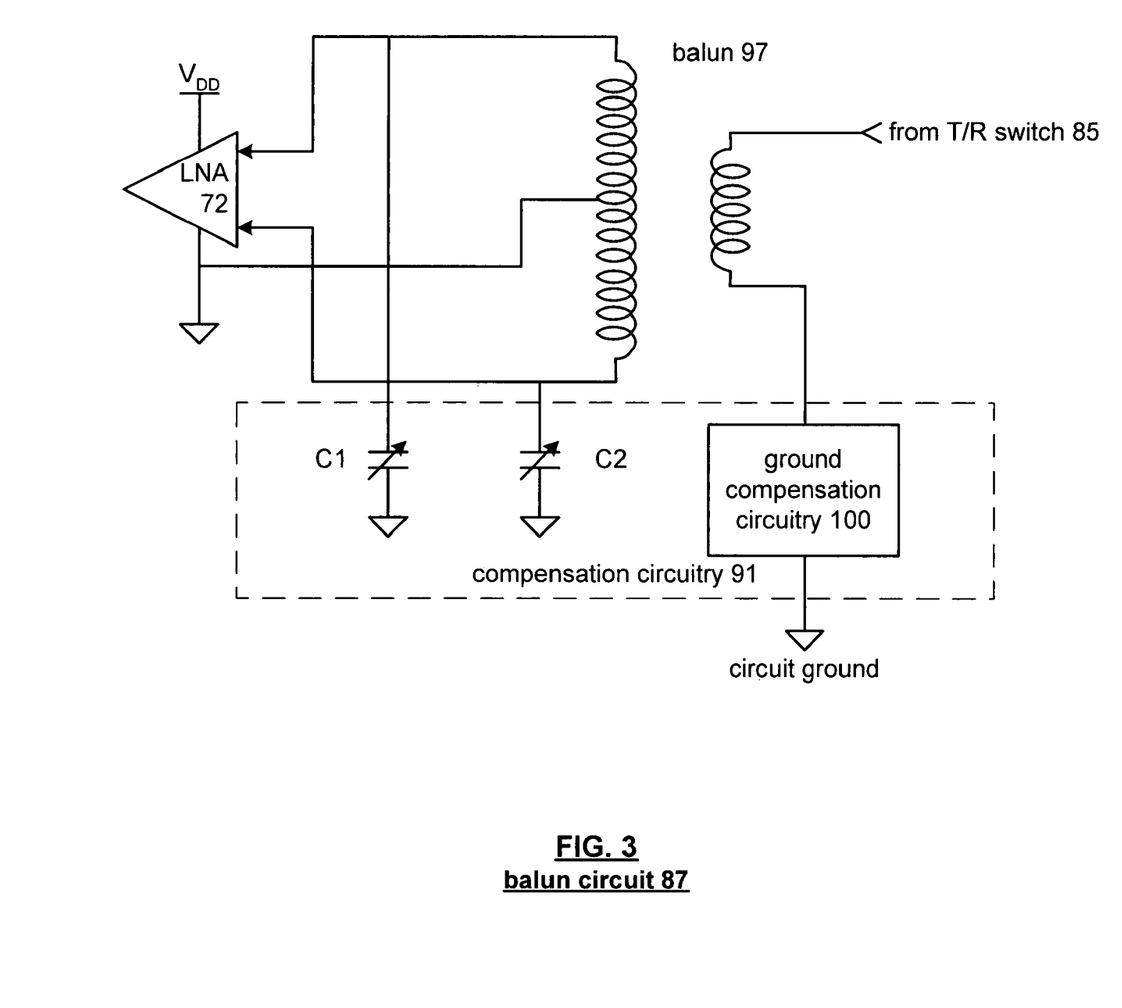
FIG. 3 is a schematic block diagram of a balanced low noise amplifier circuit in accordance with the present invention.

FIG. 3 is a schematic block diagram of the transformer balun circuit 87 that includes a balun 97 and compensation circuitry 91. The compensation circuitry 91 includes ground compensation circuitry 100 and two adjustable capacitors C1 and C2. The balun 97 includes a single ended winding coupled to the T/R switch 85 and a differential winding coupled to the LNA 72. The differential winding includes a center tap that is coupled to the circuit ground connection of the LNA 72, which helps to reduce amplitude imbalances.

During a calibration mode of the radio 60, the input and/or output impedance of the balun circuit 87 is determined. If the measured impedance is not at a desired level (e.g., 50 Ohms for the input impedance), one or more of capacitors C1 and C2 are adjusted to change the impedance such that impedance imbalances are reduced.

The ground compensation circuitry 100, which will described in greater detail with reference to FIGS. 4 and 5, reduces phase imbalances of the balun circuit 87. In one embodiment, the balun 97 may have a turns ratio of 7 to 2 with inductance values ranging from a few tenths of a nano-Henry to tens of nano-Henries. The capacitance values of capacitors C1 and C2 may range from a few tenths of a pico-Farad to hundreds of pico-Farads depending on the frequency range of operation of the radio 60.

Figure 4:
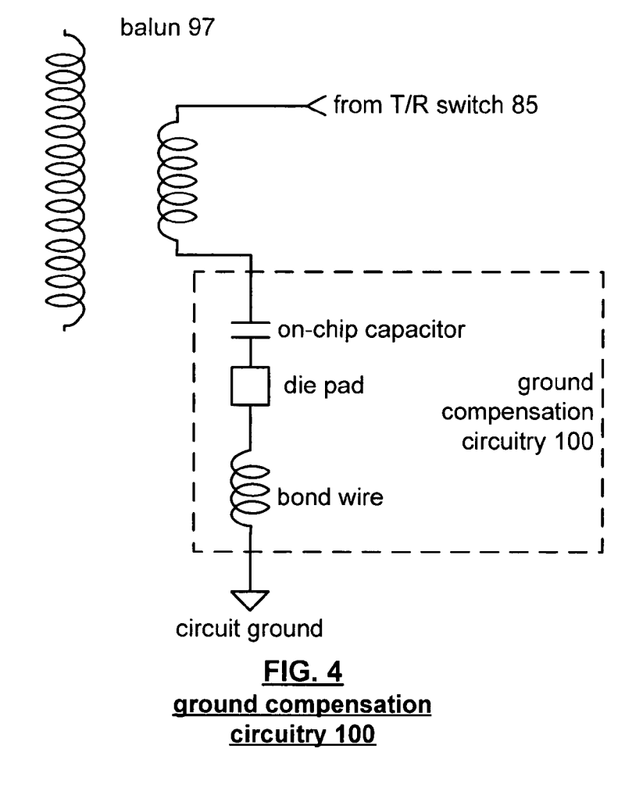
FIGS. 4 and 5 are schematic block diagrams of compensation circuitry in accordance with the present invention.

FIG. 4 is a schematic block diagram of an embodiment of the ground compensation circuitry 100. In this embodiment, the ground compensation circuitry 100 includes an on-chip capacitor, a die pad, and a bond wire coupled to a circuit ground. The capacitance value of the on-chip capacitor is selected to resonate with the inductance of the bond wire at operating frequencies of the radio 60. As such, a low impedance ground is provided at the operating frequencies thereby reducing phase imbalances of the balun circuit 87.

Figure 5:
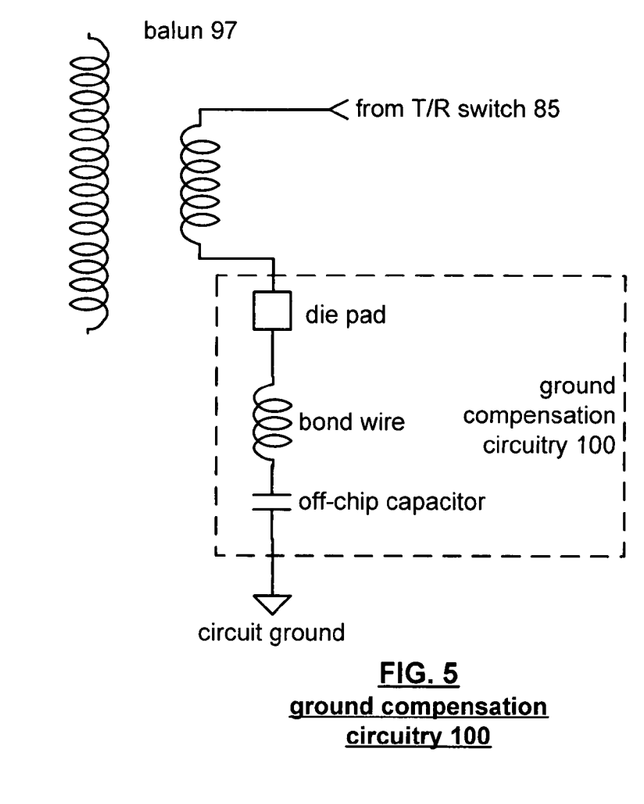

FIG. 5 is a schematic block diagram of another embodiment of the ground compensation circuitry 100. In this embodiment, the ground compensation circuitry 100 includes a die pad, a bond wire, and an off-chip capacitor coupled to a circuit ground. The capacitance value of the off-chip capacitor is selected to resonate with the inductance of the bond wire at operating frequencies of the radio 60. As such, a low impedance ground is provided at the operating frequencies thereby reducing phase imbalances of the balun circuit 87.

Figure 6:
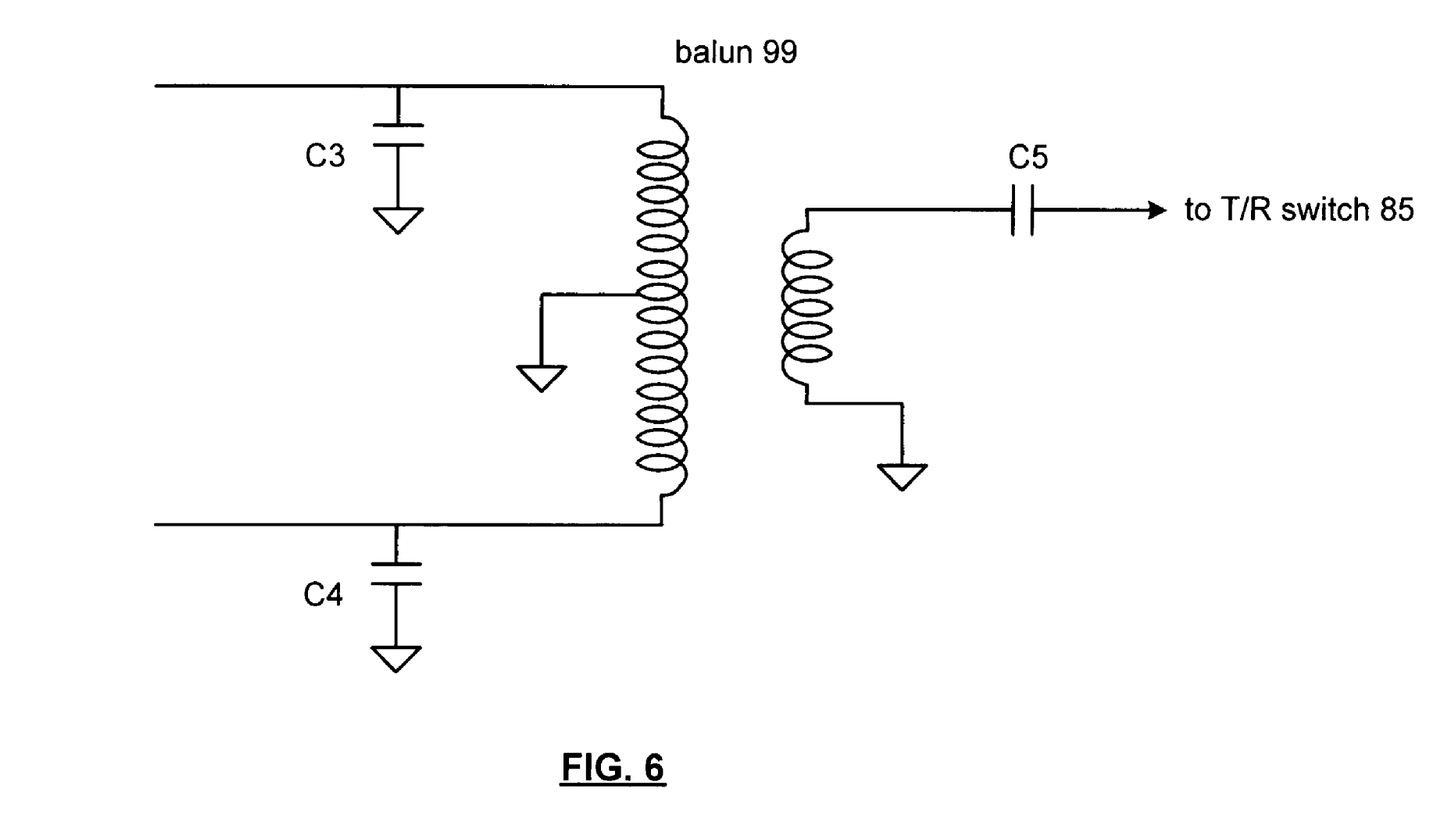
FIG. 6 is a schematic block diagram of a tuned transformer balun circuit in accordance with the present invention.

FIG. 6 is a schematic block diagram of a tuned transformer balun circuit 89 that includes a transformer balun 99, a $1^{st}$ capacitor C5, a $2^{nd}$ capacitor C3, and a $3^{rd}$ capacitor C4. The transformer balun 99 includes a single-ended winding and a differential winding. The single-ended winding is coupled to the T/R switch via capacitor C5. The differential winding is coupled to the power amplifier 84. The antenna 86, via the T/R switch, and the power amplifier 84 provide a load on the transformer balun 99. To provide efficient energy transfer while in the transmit mode, capacitor C3, C4 and C5 are tuned to resonant with the inductance of the transformer balun 99 taking into account the loading provided by antenna 86 and the power amplifier 84. In one embodiment, the inductance of the transformer may be in the neighborhood of a few tenths of nano-henries to nano-henries and the capacitance value of each capacitor C3, C4 and C5 may be in the range of tens of femto-farads to pico-farads.

As one of average skill in the art will appreciate, by tuning the impedance on the single-ended winding via capacitor C5 and tuning the impedance on the differential winding via capacitor C3 and C4, the impedance on the single-ended side may substantially match the impedance on the differential side thereby enabling more efficient energy transfer when the radio is in the transmit mode.

As one of average skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a tunable transceiver front end that compensates for amplitudes imbalances, impedances imbalances, and/or phase imbalances. As one of average skill in the art will appreciate, other embodiments may be derived from the teachings of the present invention without deviating from the scope of the claims.

What is claimed is:

1. A transceiver front end comprises:
    a transmit/receive (T/R) switch operably coupled to an antenna for receiving inbound radio frequency (RF) signals and for transmitting outbound RF signals;
    a first balun having a single ended winding and a differential winding, wherein the single ended winding of the first balun is operably coupled to the T/R switch;
    a second balun having a single ended winding and a differential winding, wherein the single ended winding of the second balun is operably coupled to the T/R switch;
    a low noise amplifier (LNA) operably coupled to the differential winding of the first balun;
    a power amplifier operably coupled to the differential winding of the second balun; and
    compensation circuitry operably coupled to the first balun to compensate for at least one of phase imbalance, amplitude imbalance, and impedance imbalance of the first balun, wherein the compensation circuitry includes ground compensation circuitry operably coupling one node of the single ended winding of the first balun to a circuit ground, and wherein the ground compensation circuitry includes a capacitor, a die pad, and a bond wire coupled in series between the single ended winding of the first balun and the circuit ground such that the capacitor resonates with the bond wire at frequencies of the inbound and outbound RF signals to compensate for phase imbalance of the first balun.

2. The transceiver front end of claim 1 comprises:
    the capacitor including an on-chip capacitor having a first plate and a second plate, wherein the first plate of the on-chip capacitor is coupled to a first node of the single ended winding of the first balun;
    the die pad coupled to the second plate of the on-chip capacitor; and
    the bond wire coupling the die pad to the circuit ground, wherein the on-chip capacitor resonates with the bond wire at frequencies of the inbound and outbound RF signals to compensate for the phase imbalance of the first balun.

3. The transceiver front end of claim 1 comprises:
    the die pad coupled to a first node of the single ended winding of the first balun; and
    the capacitor including an off-chip capacitor having a first plate and a second plate, wherein the second plate of the off-chip capacitor is coupled to the circuit ground; and
    the bond wire coupled to the die pad and the first plate of the off-chip capacitor, wherein the off-chip capacitor resonates with the bond wire at frequencies of the inbound and outbound RF signals to compensate for the phase imbalance of the first balun.

4. The transceiver front end of claim 1, wherein the compensation circuitry comprises:
    a first variable capacitor having a first plate and a second plate, wherein the first plate of the first variable capacitor is coupled to a first node of the differential winding of the first balun and the second plate of the first variable capacitor is coupled to an LNA circuit ground; and
    a second variable capacitor having a first plate and a second plate, wherein the first plate of the second variable capacitor is coupled to a second node of the differential winding of the first balun and the second plate of the second variable capacitor is coupled to the LNA circuit ground, wherein the first and second variable capacitors adjust for the impedance imbalance of the first balun.

5. The transceiver front end of claim 1 comprises:
    second compensation circuitry coupled to the second balun to compensate for at least one of phase imbalance, amplitude imbalance, and impedance imbalance of the second balun.

6. The transceiver front end of claim 1, wherein the first balun comprises:
    a center tap of the differential winding coupled to an LNA circuit ground to compensate for the amplitude imbalance of the first balun.

7. A balanced low noise amplifier (LNA) circuit comprises:
    a balun having a single ended winding and a differential winding, wherein the single ended winding of the balun is operably coupled to receive inbound radio frequency (RF) signals;
    a low noise amplifier operably coupled the differential winding of the balun; and
    compensation circuitry operably coupled to the balun to compensate for at least one of phase imbalance, amplitude imbalance, and impedance imbalance of the balun, wherein the compensation circuitry includes ground compensation circuitry operably coupling one node of the single ended winding of the balun to a circuit ground, and wherein the ground compensation circuitry includes a capacitor, a die pad, and a bond wire coupled in series between the single ended winding of the balun and the circuit ground such that the capacitor resonates with the bond wire at frequencies of an inbound RF signal to compensate for phase imbalance of the balun.

8. The balanced LNA circuit of claim 7 comprises:
the capacitor including an on-chip capacitor having a first plate and a second plate, wherein the first plate of the on-chip capacitor is coupled to a first node of the single ended winding of the balun;
the die pad coupled to the second plate of the on-chip capacitor; and
the bond wire coupling the die pad to the circuit ground, wherein the on-chip capacitor resonates with the bond wire at frequencies of the inbound RF signals to compensate for the phase imbalance of the balun.

9. The balanced LNA circuit of claim 7 comprises:
the die pad coupled to a first node of the single ended winding of the balun; and
the capacitor including an off-chip capacitor having a first plate and a second plate, wherein the second plate of the off-chip capacitor is coupled to the circuit ground; and
the bond wire coupled to the die pad and the first plate of the off-chip capacitor, wherein the off-chip capacitor resonates with the bond wire at frequencies of the inbound RF signals to compensate for the phase imbalance of the balun.

10. The balanced LNA circuit of claim 7, wherein the compensation circuitry comprises:
a first variable capacitor having a first plate and a second plate, wherein the first plate of the first variable capacitor is coupled to a first node of the differential winding of the balun and the second plate of the first variable capacitor is coupled to an LNA circuit ground; and
a second variable capacitor having a first plate and a second plate, wherein the first plate of the second variable capacitor is coupled to a second node of the differential winding of the balun and the second plate of the second variable capacitor is coupled to the LNA circuit ground, wherein the first and second variable capacitors adjust for the impedance imbalance of the balun.

11. The balanced LNA circuit of claim 7, wherein the balun comprises:
a center tap of the differential winding coupled to an LNA circuit ground to compensate for the amplitude imbalance of the balun.

* * * * *